United States Patent
Ohtsubo et al.

(10) Patent No.: US 8,940,187 B2
(45) Date of Patent: Jan. 27, 2015

(54) CERAMIC COMPOSITE FOR LIGHT CONVERSION, PROCESS FOR PRODUCTION THEREOF, AND LIGHT-EMITTING DEVICES PROVIDED WITH SAME

(75) Inventors: Hideki Ohtsubo, Yamaguchi (JP); Shin-Ichi Sakata, Yamaguchi (JP); Shinichi Ishitobi, Yamaguchi (JP); Yasuyuki Ichizono, Yamaguchi (JP); Norifumi Miyamoto, Yamaguchi (JP); Hisayoshi Iba, Yamaguchi (JP)

(73) Assignee: UBE Industries, Ltd (JP)

( * ) Notice: Subject to any disclaimer, the term of this patent is extended or adjusted under 35 U.S.C. 154(b) by 354 days.

(21) Appl. No.: 13/638,021
(22) PCT Filed: Mar. 14, 2011
(86) PCT No.: PCT/JP2011/055935
§ 371 (c)(1),
(2), (4) Date: Nov. 29, 2012
(87) PCT Pub. No.: WO2011/125422
PCT Pub. Date: Oct. 13, 2011

(65) Prior Publication Data
US 2013/0088143 A1 Apr. 11, 2013

(30) Foreign Application Priority Data
Mar. 31, 2010 (JP) .................. 201 0081016
Mar. 31, 2010 (JP) .................. 2010-081024

(51) Int. Cl.
*C09K 11/80* (2006.01)
*C09K 11/08* (2006.01)
(Continued)

(52) U.S. Cl.
CPC ........... *C09K 11/7716* (2013.01); *C04B 35/117* (2013.01); *C04B 35/44* (2013.01);
(Continued)

(58) Field of Classification Search
USPC ....... 252/301.4 R; 313/305; 257/98; 501/152, 501/127
See application file for complete search history.

(56) References Cited

U.S. PATENT DOCUMENTS 8,608,978 B2* 12/2013 Mitani et al. ........... 252/301.4 R
2006/0250069 A1 11/2006 Sakata et al.

FOREIGN PATENT DOCUMENTS

CN 100428511 10/2008
EP 1 837 921 A1 9/2007
(Continued)

OTHER PUBLICATIONS

Bando et al.; "Shomei Kogen o Mezashita GaN-kei Hakko Diode"; Oyo Butsuri, 2002, vol. 71, No. 12, pp. 1517-1522.
(Continued)

*Primary Examiner* — Carol M Koslow
(74) *Attorney, Agent, or Firm* — Clark Hill PLC

(57) ABSTRACT

Provided are a ceramic composite for light conversion, which is capable of maintaining a high radiant flux even when the proportion of Gd and Ce is increased to tune the fluorescence peak wavelength to the longer wavelength side, a process for producing the ceramic composite, and a light emitting device including the ceramic composite. The ceramic composite for light conversion is a solidification product including a composition that is represented by a specific formula, and has a texture of continuously and three-dimensionally mutually entangled oxide phases including at least two phases of a first phase and a second phase, characterized in that the first phase is a $Y_3Al_5O_{12}$ fluorescent phase activated with Ce, and the second phase is an $Al_2O_3$ phase, and the first phase and second phase account for 97% by area or more of a cross section of the solidification product, or characterized in that the first phase is a $Y_3Al_5O_{12}$ fluorescent phase activated with Gd and Ce, and the second phase is an $Al_2O_3$ phase, and the first phase and second phase account for 97% by area or more of a cross section of the solidification product.

20 Claims, 3 Drawing Sheets

(51) Int. Cl.
*H01L 33/00* (2010.01)
*C09K 11/77* (2006.01)
*C04B 35/117* (2006.01)
*C04B 35/44* (2006.01)
*C04B 35/65* (2006.01)
*C04B 35/653* (2006.01)
*H01L 33/50* (2010.01)
*H05B 33/14* (2006.01)

(52) U.S. Cl.
CPC ............ *C04B 35/652* (2013.01); *C04B 35/653* (2013.01); *H01L 33/502* (2013.01); *H05B 33/14* (2013.01); *C09K 11/7774* (2013.01); *C04B 2235/3217* (2013.01); *C04B 2235/3222* (2013.01); *C04B 2235/3224* (2013.01); *C04B 2235/3225* (2013.01); *C04B 2235/3229* (2013.01); *C04B 2235/764* (2013.01); *C04B 2235/80* (2013.01); *H01L 33/505* (2013.01)
USPC ...... 252/301.4 R; 313/503; 257/98; 501/152; 501/127

(56) References Cited

FOREIGN PATENT DOCUMENTS

| | | |
|---|---|---|
| EP | 1 980 606 A1 | 10/2008 |
| EP | 2 070 891 A1 | 6/2009 |
| JP | 10-017396 | 1/1998 |
| JP | 2000-208815 | 7/2000 |
| KR | 10-2005-0093839 | 9/2005 |
| WO | 2004-065324 A1 | 8/2004 |
| WO | 2006/064930 A1 | 6/2006 |
| WO | 2007/051108 A2 | 5/2007 |
| WO | 2007/083828 A1 | 7/2007 |
| WO | WO 2007/083828 * | 7/2007 |
| WO | 2008/041566 A1 | 4/2008 |

OTHER PUBLICATIONS

Ichikawa et al.; "Kidorui Keikotai o Mochiita Hakushoku LED no Genjo to Shorai"; Material Integration, 2003, vol. 16, No. 7, pp. 41-46.

Pan et al.; Tailored photoluminescence of YAG:Ce phosphor through various methods; Journal of Physics and Chemistry of Solids, 2004, vol. 65, pp. 845-850.

Extended European Search Report which issued in connection with corresponding European Application No. 11765324.6 on Dec. 4, 2013.

* cited by examiner

CERAMIC COMPOSITE FOR LIGHT CONVERSION, PROCESS FOR PRODUCTION THEREOF, AND LIGHT-EMITTING DEVICES PROVIDED WITH SAME

RELATED/PRIORITY APPLICATION

This application is a National Phase filing regarding International Application No. PCT/JP2011/055935, filed on Mar. 14, 2011, which relies upon Japanese Patent Application No. 2010-081016 filed on Mar. 31, 2010 and Japanese Patent Application No. 2010-081024 filed on Mar. 31, 2010 for priority.

TECHNICAL FIELD

The present invention relates to a ceramic composite for light conversion for use in light emitting diodes and the like which can be used for displays, lightings, backlight sources, etc., a process for producing the ceramic composite, and a light emitting device including the ceramic composite.

BACKGROUND ART

In recent years, development research has been carried out actively on white light emitting devices with a blue light emitting element as a light emitting source. In particular, white light emitting diodes using a blue light emitting diode element are light in weight, use no mercury, and are long in lifetime, and the demand for the diodes are thus expected to be hence expanded rapidly. It is to be noted that a light emitting device using a light emitting diode element as a light emitting element is referred to as a light emitting diode. In the most commonly adopted method as a method for converting blue light from a blue light emitting diode element to white light, a white color is obtained in a pseudo fashion by color mixing with a yellow color in complementary relationship with a blue color. As described in, for example, Patent Literature 1, a white light emitting diode can be configured in such a way that a coating layer containing a phosphor which partially absorbs blue light to emit yellow light is provided on the front of a light emitting diode element which emits blue light, and a mold layer or the like is provided ahead which mixes blue light from the light source with yellow light from the phosphor. As the phosphor, a $YAG(Y_3Al_5O_{12})$ powder activated cerium (hereinafter, referred to as YAG:Ce) or the like is used.

However, in the case of the structures of now commonly used white light emitting diodes typified by Patent Literature 1, a powdered phosphor is mixed with a resin such as epoxy, and applied, thus, it is difficult to ensure homogeneity in the mixing state of the powdered phosphor and the resin, and control stabilization or the like of the thickness of the applied film, and it is pointed out that the white light emitting diodes are likely to cause color unevenness or variability. In addition, the resin required in the case of using the powdered phosphor is inferior in heat resistance as compared with metals or ceramics, and thus likely to cause a decrease in transmittance due to the resin modified by heat from the light emitting element. Therefore, this decrease in transmittance is problematic for higher outputs of white light emitting diodes required now.

The inventors have proposed a ceramic composite for light conversion, which is composed of a solidification product formed from continuously and three-dimensionally mutually entangled multiple oxide phases including a YAG:Ce fluorescent phase and an $Al_2O_3$ phase, and a white light emitting device configured with the use of a blue light emitting element and the ceramic composite for light conversion (Patent Literature 2). The ceramic composite for light conversion can stably achieve homogeneous yellow fluorescence because the YAG:Ce fluorescent phase is distributed homogeneously, and has excellent heat resistance because of being a ceramic. In addition, the ceramic composite itself is a bulk body, and thus requires no resin for constituting the white light emitting device, unlike in Patent Literature 1. For this reason, the white light emitting device is reduced in color unevenness or variability, and preferred for higher outputs.

In the case of a white light emitting device using a blue light emitting diode element and a YAG:Ce phosphor, light from the blue light emitting diode element commonly used now has a peak wavelength around 460 nm for blue (for example, CIE 1931 chromaticity coordinates (hereinafter, chromaticity coordinates) Cx=0.135, Cy=0.08). This is because the luminous efficiency of the YAG:Ce phosphor is high in this wavelength range. By the way, the fluorescence color of a YAG:Ce (hereinafter, non-adjusted YAG:Ce) phosphor which has an untuned emission wavelength is yellow (for example, chromaticity coordinates Cx=0.41, Cy=0.56) with a peak wavelength around 530 to 545 nm. For this season, color mixing of the light around 460 nm from the blue light emitting diode element and the light from the non-adjusted YAG:Ce phosphor results in a deviation from a white color (for example, 6000K:chromaticity coordinates Cx=0.32, Cy=0.34) toward a green side. Therefore, in order to achieve a white color from this configuration, there is a need to use a YAG:Ce phosphor with a fluorescence peak wavelength on the further red side (longer wavelength side).

As for a YAG:Ce phosphor, it is known as known art that the increased content of Ce as an activator can shift the peak of the fluorescence wavelength to the longer wavelength side (Non-Patent Literature 1). Thus, the peak of the fluorescence wavelength of the YAG:Ce phosphor can be transferred to around 560 nm.

In addition, as for a YAG:Ce phosphor, it is known as known art that, for example, the Y element partially substituted with a Gd element can shift the peak of the fluorescence wavelength to the longer wavelength side (Non-Patent Literatures 2 and 3). Patent Literature 2 proposes that a YAG:Ce phosphor with a fluorescence wavelength thus tuned to the longer wavelength side is combined with a blue light emitting diode element to constitute a white light emitting diode, and thereby achieve a white color (CIE chromaticity coordinates Cx=0.33, Cy=0.33).

In the case of the ceramic composite for light conversion as described in Patent Literature 2, the inventors also demonstrate that the adjustment of the composition of the entire solidification product can tune the peak of the fluorescence wavelength in the range of 550 to 560 nm or 540 to 580 nm (Patent Literature 3).

CITATION LIST

Patent Literatures

Patent Literature 1: Japanese Patent Application Laid-Open (JP-A) No. 2000-208815
Patent Literature 2: International Publication No. 2004/065324
Patent Literature 3: International Publication No. 2007/051108

Non-Patent Literatures

Non-Patent Literature 1: J. Physics and Chemistry of Solids, vol. 65 (2004) p. 845-850

Non-Patent Literature 2: Material Integration, vol. 16, No. 7, (2003) p. 41-46

Non-Patent Literature 3: Japanese Journal of Applied Physics, vol. 71, No. 12 (2002) p. 1518-1522

SUMMARY OF INVENTION

Technical Problem

However, in the case of the ceramic composite for light conversion, which is obtained by the method described in Patent Literature 3, when the peak of the fluorescence wavelength of the ceramic composite for light conversion is tuned to the longer wavelength side, the value of integral (total radiant flux) is reduced for the white light spectrum obtained.

The following reason is considered as a reason for the reduced total radiant flux. While the oxide phases constituting the ceramic composite 1 for light conversion include at least two phases of a YAG:Ce phase, an $Al_2O_3$ phase, a $(Y,Ce)AlO_3$ phase, a $(Y,Ce)_4Al_2O_9$ phase, a $CeAl_{11}O_{18}$ phase, a $Y_2O_3$ phase, and a $CeO_2$ phase, etc., or in the case of containing a Gd element, include at least two phases of a YAG:(Gd, Ce) phase, an $Al_2O_3$ phase, a $(Y, Gd, Ce)AlO_3$ phase, a $(Y, Gd, Ce)_4Al_2O_9$ phase, a $(Gd, Ce)Al_{11}O_{18}$ phase, a $Y_2O_3$ phase, a $Gd_2O_3$ phase, and a $CeO_2$ phase, etc, the phases other than the YAG:Ce phase and the YAG:(Gd, Ce) phase as well as the $Al_2O_3$ phase are often poor in continuity, and likely to scatter light, and decrease the light transmittance. In particular, the Ce fraction of the YAG:Ce phase and the Gd and Ce fractions of YAG:(Gd, Ce) phase can be increased to tune the fluorescence peak wavelength of the ceramic composite for light conversion to the longer wavelength side, while the proportion of Gd or Ce is increased in the composition of the entire ceramic composite for light conversion, thereby having a tendency to also increase the volumetric proportions of the $CeAlO_3$ phase and $CeAl_{11}O_{18}$ phase, etc. containing a high proportion of Ce, as well as the $(Gd, Ce)AlO_3$ phase and $(Gd, Ce) Al_{11}O_{18}$ phase, etc. containing a high proportion of Gd and/or Ce. Thus, the radiant flux for the white light spectrum is considered to be decreased.

In addition, Patent Literature 2 discloses, in Example 1, a ceramic composite material for light conversion, which is composed of only a YAG:Ce phase and an $Al_2O_3$ phase. While the raw material composition of the ceramic composite material for light conversion has x'=0.8200 and c'=0.0033 in the composition formula represented by the following formula (3), the peak wavelength of fluorescence emitted upon incidence of blue light of about 470 nm is only 530 nm because the Ce fraction of the YAG:Ce phase is low in the case of a solidification product produced.

Thus, an object of the present invention is to provide a ceramic composite for light conversion, which is capable of maintaining a high radiant flux even when the proportion of Gd and Ce is increased to tune the fluorescence peak wavelength to the longer wavelength side, a process for producing the ceramic composite, and a light emitting device including the ceramic composite.

Solution to Problem

In order to achieve the object mentioned above, the inventors have found, as a result of keeping earnest research, that the production of the phases other than a YAG:Ce phase and a YAG:(Gd, Ce) phase, as well as an $Al_2O_3$ phase can be suppressed to achieve a ceramic composite for light conversion, which maintains a high radiant flux even when the fluorescence peak wavelength is tuned to the longer wavelength side.

More specifically, the present invention provides a ceramic composite for light conversion, the ceramic composite is a solidification product including a composition which is represented by the formula (1), and has a texture of continuously and three-dimensionally mutually entangled oxide phases including at least two phases of a first phase and a second phase, characterized in that the first phase is a $Y_3Al_5O_{12}$ fluorescent phase activated with Ce, and the second phase is an $Al_2O_3$ phase, and the first phase and second phase account for 97% by area or more of a cross section of the solidification product.

[Formula 1]

$$xAlO_{3/2}\text{-}y(aYO_{3/2}\text{-}cCeO_2) \quad (1)$$

(x, y, a, and c represent molar fractions, 0.770<x<0.835; 0.002≤c<0.012; x+y=1; and a+c=1)

In addition, the present invention provides a ceramic composite for light conversion, the ceramic composite is a solidification product including a composition which is represented by the formula (2), and has a texture of continuously and three-dimensionally mutually entangled oxide phases including at least two phases of a first phase and a second phase, characterized in that the first phase is a $Y_1Al_5O_{12}$ fluorescent phase activated with Gd and Ce, and the second phase is an $Al_2O_3$ phase, and the first phase and second phase account for 97% by area or more of a cross section of the solidification product.

[Formula 2]

$$xAlO_{3/2}\text{-}y(aYO_{3/2}\text{-}bGdO_{3/2}\text{-}cCeO_2) \quad (2)$$

(x, y, a, b, and c represent molar fractions, 0.770<x<0.835; 0<b<0.2, 0<c<0.01; x+y=1; and a+b+c=1)

In addition, the present invention provides a light emitting device characterized in that it includes a light emitting element and the ceramic composite for light conversion.

Furthermore, the present invention provides a method for producing a ceramic composite for light conversion, by melting a raw material oxide and solidifying the melt by an unidirectional solidification method, characterized in that the raw material oxide is a composition represented by the formula (3), a temperature gradient of 40° C./cm or more is provided in the solidification direction of the unidirectional solidification method, and the transfer rate is 25 mm/hour or less in the solidification direction.

[Formula 3]

$$x'AlO_{3/2}\text{-}y'(a'YO_{3/2}\text{-}c'CeO_2) \quad (3)$$

(x', y', a', and c' represent molar fractions, 0.770<x'<0.835; 0.004≤c'<0.04; x'+y'=1; and a'+c'=1)

In addition, the present invention provides a method for producing a ceramic composite for light conversion, by melting a raw material oxide and solidifying the melt by an unidirectional solidification method, characterized in that the raw material oxide is a composition represented by the formula (4), a temperature gradient of 40° C./cm or more is provided in the solidification direction of the unidirectional solidification method, and the transfer rate is 25 mm/hour or less in the solidification direction.

[Formula 4]

$$x'AlO_{3/2}\text{-}y'(a'YO_{3/2}\text{-}b'GdO_{3/2}\text{-}c'CeO_2) \quad (4)$$

(x', y', a', b', and c' represent molar fractions, 0.770<x'<0.835; 0<b'<0.3, 0.001≤c'<0.04; x'+y'=1; and a'+b'+c'=1)

Advantageous Effects of Invention

As described above, the present invention can provide a ceramic composite for light conversion, which is capable of maintaining a high radiant flux even when the proportion of Gd and Ce is increased to tune the fluorescence peak wavelength to the longer wavelength side, a process for producing the ceramic composite, and a light emitting device including the ceramic composite.

DESCRIPTION OF EMBODIMENTS

The present invention will be described below in detail.
[Ceramic Composite for Light Conversion]

Figure 2:
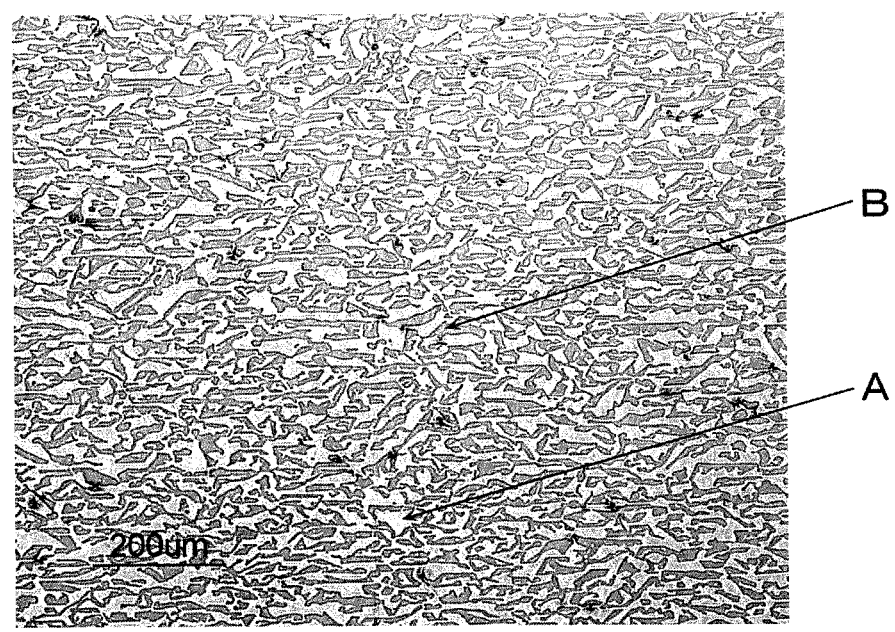
FIG. 2 is a micrograph of a cross section of a ceramic composite for light conversion according to Example 1.

The ceramic composite for light conversion according to the present invention is a solidification product composed of a composition represented by the formula (1) or the formula (2), which has a texture of continuously and three-dimensionally mutually entangled oxide phases composed of at least two phases of a first phase and a second phase. The "texture of continuously and three-dimensionally mutually entangled oxide phases composed of at least two phases of a first phase and a second phase" refers to a texture in which oxide phases are present in direct contact with each other without any boundary phase such as amorphous between the respective phases as shown in FIG. 2.

The x, y, a, and c in the formula (1) can be obtained by the following method. The ground product of the ceramic composite for light conversion according to the present invention is melted by heating with sodium carbonate and boric acid, and dissolved by heating with the addition of hydrochloric acid and sulfuric acid. The dissolved product obtained is subjected to inductively-coupled plasma atomic emission spectrometry (ICP-AES) to obtain the relative weights of Al, Y, and Ce, and from the results, the x, y, a, and c are calculated.

When the x in the formula (1) is 0.770 or less, or 0.835 or more, a coarsening region of the first phase or the second phase is extensively caused in the solidification product to make the solidification product likely to be cracked.

When the c in the formula (1) is smaller than 0.002, the peak wavelength of fluorescence emitted by absorbing light with a peak at a wavelength of 420 nm to 500 nm is a short wavelength such as, for example, less than 550 nm. When the c is 0.012 or more, a composite oxide phase such as a $CeAlO_3$ phase or a $CeAl_{11}O_{18}$ phase is present at a high ratio by volume, which is phase other than the first phase and the second phase.

In addition, the x, y, a, b, and c in the formula (2) can be obtained by the following method. The ground product of the ceramic composite for light conversion according to the present invention is melted by heating with sodium carbonate and boric acid, and dissolved by heating with the addition of hydrochloric acid and sulfuric acid. The dissolved product obtained is subjected to inductively-coupled plasma atomic emission spectrometry (ICP-AES) to obtain the relative weights of Al, Y, Gd, and Ce, and from the results, the x, y, a, b, and c are calculated.

When the x in the formula (2) is 0.770 or less, or 0.835 or more, a coarsening region of the first phase or the second phase is extensively caused in the solidification product to make the solidification product likely to be cracked.

When the b in the formula (2) is 0.2 or more, a composite oxide phase such as a (Gd, Ce)$AlO_3$ phase or a (Gd, Ce)$Al_{11}O_{18}$ phase is present at a high ratio by volume, which is a phase other than the first phase and the second phase.

When the c in the formula (2) is 0.01 or more, composite oxide phase such as a $CeAlO_3$ phase or a $CeAl_{11}O_{18}$ phase is present at a high ratio by volume, which is a phase other than the first phase and the second phase.

In the ceramic composite for light conversion according to the present invention, the first phase and the second phase account for 97% by area or more of a cross section of the solidification product, and preferably, the first phase and the second phase account for 98% by area or more therein. At lower than 97% by area, in the case of constituting a white light emitting device from a blue light emitting element and the ceramic composite for light conversion according to the present invention, the total radiant flux will be lower which is obtained from the white light emitting device.

The oxide phase other than the first phase and the second phase is typically at least any one composite oxide phase of a $CeAlO_3$ phase, a $CeAl_{11}O_{18}$ phase, and a (Y,Ce)$AlO_3$ phase, or if any Gd is contained, at least any one composite oxide phase of a (Gd, Ce)$AlO_3$ phase, a (Gd, Ce)$Al_{11}O_{18}$ phase, and a (Y, Gd, Ce)$AlO_3$ phase.

The total area (%) of the first phase and the second phase in a cross section of the solidification product can be obtained as follows. First, from an X-ray diffraction pattern for a ground product of the ceramic composite for light conversion according to the present invention, the constituent phases of the ceramic composite for light conversion are identified. Then, a cross section perpendicular to the solidification product in the ceramic composite for light conversion according to the present invention is polished until a mirror surface is obtained. The cross section is photographed through a scanning electron microscope. This photographing provides a reflected electron image in which differences in the compositions of the constituent phases are indicated by differences in monochrome brightness (white to black), and the differences between the constituent phases can be clearly distinguished by the brightness. At the same time, a mapping diagram of constituent elements in the same field of view as the reflected electron image is obtained through an elemental analysis with an EDS (Energy Dispersive Spectroscopy) system attached to the scanning electron microscope. From the foregoing results, the first phase (YAG:Ce phase or YAG:(Gd, Ce) phase) and the second phase ($Al_2O_3$ phase) are clarified on the reflected electron image. Then, the areas of the region identified as the first phase and of the region identified as the second phase on the reflected electron image are each measured, and from the measured areas and the area of the entire reflected electron image, the area (%) of the first phase and second phase is obtained in the cross section of the solidification product. The measurement is made from reflected electron images in at least five fields of view, and the average value can be regarded as the area (%) of the first phase and second phase in the cross section of the solidification product.

The ceramic composite for light conversion according to the present invention preferably produces fluorescence with a peak at 550 to 565 nm by absorbing light (excitation light) with a peak at a wavelength of 420 to 500 nm. Furthermore, in the case of containing Gd, the ceramic composite preferably produces fluorescence with a peak at 550 to 580 nm by absorbing light (excitation light) with a peak at a wavelength of 420 to 500 nm. This absorption can efficiently achieve yellow fluorescence. Even when the excitation light has wavelengths of 400 to 419 nm, or 501 to 530 nm, the ceramic composite for light conversion according to the present invention can produce fluorescence although the efficiency is decreased. Furthermore, even when the excitation light is near-ultraviolet with wavelengths of 300 to 360 nm, the ceramic composite for light conversion according to the present invention can produce fluorescence. The peak wavelength of the fluorescence can be measured by a solid-state quantum efficiency measurement system of FP6500 from JASCO Corporation combined with an integrating sphere. For fluorescence corrections, corrections can be made by a secondary standard light source. The peak wavelength of the fluorescence may cause a slight difference, depending on the measurement device used, the condition for the correction, etc.

The peak wavelength of fluorescence emitted by the ceramic composite for light conversion according to the present invention is generally shifted to the longer wavelength side as the Ce substitution amount is increased at the Y site of the first phase (YAG:Ce phase), and can be shifted to approximately 565 nm. In addition, the Ce substitution amount can be adjusted depending on c' in the formula (3), that is, the mole fraction of Ce, and after-mentioned production conditions. Furthermore, in the case of containing Gd, the peak wavelength is shifted to the longer wavelength side as the Gd and Ce substitution amounts are increased at the Y site of the first phase (YAG:(Gd, Ce) phase), and can be shifted to approximately 580 nm. In addition, the Gd and Ce substitution amounts can be adjusted depending on b' and c' in the formula (4), that is, the mole fractions of Gd and Ce, and after-mentioned production conditions.

The ceramic composite for light conversion according to the present invention may be processed into an appropriate shape such as a plate. The color tone can be easily controlled by changing the thickness, etc. of the ceramic composite for light conversion in the case of using the ceramic composite for light conversion in a light emitting device, and the variation in color tone can be easily kept small by maintaining the shape accuracy.

[Production Process for Ceramic Composite for Light Conversion]

The ceramic composite for light conversion according to the present invention can be prepared by melting the raw material oxide represented by the formula (3) or formula (4), and solidifying the melt by a unidirectional solidification method under predetermined conditions. For example, the solidification product can be obtained by a simple method in which the melt of the raw material oxide put in a crucible maintained at a predetermined temperature is subjected to condensation cooling (solidification) while controlling the cooling temperature. The unidirectional solidification method refers to a method in which an appropriate temperature gradient is applied to a solid phase/liquid phase interface to control crystal growth in one direction, and thereby carry out solidification. In the unidirectional solidification, the crystal phase included grows continuously in a single crystalline state.

The raw material oxide has at least one oxide phase of a fluorescent phase, and as long as the raw material oxide has a composition represented by the formula (3) or the formula (4), ceramic composite materials previously disclosed by the applicant can be used (JP-A Nos. 7-149597, 7-187893, 8-81257, 8-253389, 8-253390, and 9-67194, as well as the U.S. applications corresponding to these Japanese applications (U.S. Pat. Nos. 5,569,547, 5,484,752, and 5,902,963)). The disclosure in these applications and patents is incorporated herein by reference.

In the unidirectional solidification, the temperature decrease gradient applied in the solidification direction and the transfer rate in the solidification direction are controlled. The temperature decrease gradient is 40° C./cm or more, preferably 50° C./cm or more. If the temperature decrease gradient is lower than 40° C./cm, there will be a high volumetric proportion of a composite oxide phase produced, such as a $CeAlO_3$ phase, a $CeAl_{11}O_{18}$ phase, (Gd, Ce)$AlO_3$ phase, and (Gd, Ce)$Al_{11}O_{18}$ phase, and when a white light emitting device is configured from a blue light emitting element and the ceramic composite for light conversion according to the present invention, the total radiant flux may be lower which is obtained from the light emitting device in some cases. The transfer rate is 25 mm/hour or less, preferably 2 to 15 mm/hour. If the transfer rate is greater than 25 mm/hour, as is the case described above, there will be a high volumetric proportion of a composite oxide phase produced, such as a $CeAlO_3$ phase, a $CeAl_{11}O_{18}$ phase, (Gd, Ce)$AlO_3$ phase, and (Gd, Ce)$Al_{11}O_{18}$ phase, and when a white light emitting device is configured from a blue light emitting element and the ceramic composite for light conversion according to the present invention, the total radiant flux may be lower which is obtained from the light emitting device in some cases.

The temperature decrease gradient refers to a temperature difference of heating means for every 1 cm, which is measured with a thermocouple or the like provided at regular intervals in a direction parallel to the solidification direction, for example, in the case of carrying out the unidirectional solidification by transferring a crucible with the melt put therein, or by pulling up and down the dissolved product.

The transfer rate refers to the rate of transferring a crucible or the like in a direction parallel to the solidification direction, for example, in the case of carrying out the unidirectional solidification by transferring the crucible, or by pulling up and down the dissolved product.

The composition of the raw material oxide and the unidirectional solidification under predetermined conditions are combined appropriately as described above to produce the solidification product as a main constituent of the ceramic composite for light conversion according to the present invention. Depending on the composition of the raw material oxide and the conditions for the unidirectional solidification method, a constituent which is not contained in the ceramic composite for light conversion according to the present invention is produced in a skin portion of the solidification product. In this case, only the main constituent excluding the skin portion of the solidification product serves as the ceramic composite for light conversion according to the present invention. The volumetric proportion of the skin portion as described above is typically within 10% of the entire solidification product, and may be all removed by grinding, cutting, or the like for use as the ceramic composite for light conversion according to the present invention. It is not industrially problematic that only the skin section is a constituent which is not contained in the ceramic composite for light conversion according to the present invention.

The ceramic composite for light conversion according to the present invention does not include therein the skin portion as described above. Therefore, the compositions (formula (1) and formula (2)) of the ceramic composite for light conversion according to the present invention do not necessarily correspond to the compositions (formula (3) and formula (4)) of the raw material oxide.

[Light Emitting Device]

The light emitting device according to the present invention includes a light emitting element and the ceramic composite for light conversion according to the present invention. The light emitting element is preferably a light emitting element which emits light with a peak at a wavelength of 420 nm to 500 nm, because this wavelength excites the first phase (fluorescent phase) of the ceramic composite for light conversion to achieve fluorescence. The wavelength further preferably has a peak at 440 nm to 480 nm, because the first phase has a high excitation efficiency, thus efficiently achieving fluorescence, which is preferred for achieving a higher-efficiency light emitting device. While examples of the light emitting element include, for example, a light emitting diode element and an element for generating laser light, the light emitting element is preferably a light emitting diode element because of its small size and inexpensiveness. The light emitting diode element is preferably a blue light emitting diode element.

The ceramic composite for light conversion is preferably a ceramic composite for light conversion, which emits fluorescence with a peak at a wavelength of 550 to 565 nm, or in the case of containing Gd, a ceramic composite for light conversion, which emits fluorescence with a peak at a wavelength of 550 to 580 nm. The light emitting device is preferably a white light emitting device.

The light emitting device according to the present invention uses fluorescence obtained by irradiating the ceramic composite for light conversion with light emitted from the light emitting element, and subjecting the light transmitted through the ceramic composite for light conversion and light emitted from the light emitting element to wavelength conversion by the ceramic composite for light conversion.

Figure 1:
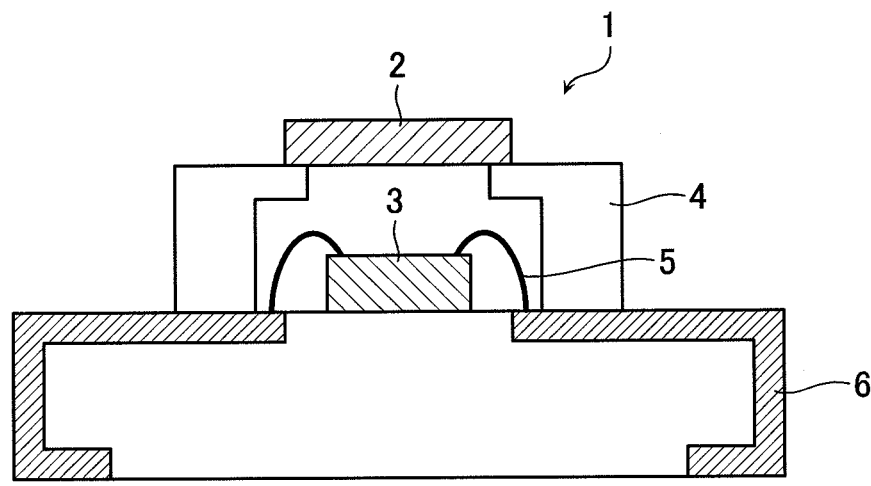
FIG. 1 is a schematic cross-sectional view illustrating an embodiment of a light-emitting device.

Examples of the light emitting device according to the present invention include, for example, the light emitting device shown in FIG. 1. The light emitting device 1 includes a ceramic composite for light conversion 2, which emits yellow fluorescence with a peak at a wavelength of 550 to 565 nm or 550 to 580 nm, and a light emitting element 3 which emits light with a peak at a wavelength of 420 nm to 500 nm. The ceramic composite for light conversion 2 is formed in the shape of a plate, with both ends supported by jigs 4. The light emitting element 3 is formed in the shape of a plate, and placed below the ceramic composite for light conversion 2 and between the jigs 4, so as to be parallel to the ceramic composite for light conversion 2 out of contact with the ceramic composite for light conversion 2 or the jigs 4. The light emitting element 3 is connected through lead wires 5 to lead electrodes 6. The light emitting element 3 is an element for emitting purple to blue light, and in order to obtain a white color depending on the wavelength of the light, the purple to blue light emitted from the light emitting element 3 is made incident on the ceramic composite for light conversion 2, which has a fluorescence peak wavelength tuned. Yellow fluorescence from the first phase (fluorescent phase) then excited and purple to blue transmitted light from the second phase (non-fluorescent phase) pass through the solidification product which has the structure of the first phase and second phase continuously and three-dimensionally mutually entangled and homogeneously distributed, thereby providing homogeneously mixed light, and thus making it possible to achieve a white color with less color unevenness.

As described above, the ceramic composite for light conversion according to the present invention has the respective oxide phases including the fluorescent phase, which are present in single crystalline states continuously and three-dimensionally mutually entangled. Therefore, homogeneous yellow fluorescence with a peak wavelength tuned to 550 to 565 nm or 550 to 580 nm can be obtained efficiently and stably from the ceramic composite for light conversion according to the present invention. In addition, the ceramic composite for light conversion according to the present invention is composed of the oxide ceramic, and thus excellent in heat resistance and durability. Furthermore, the ceramic composite for light conversion according to the present invention has very few less continuous phases other than the first phase (YAG:Ce phase or YAG:(Gd, Ce) phase) and the second phase ($Al_2O_3$ phase), and thus has a light transmittance. Therefore, when the ceramic composite for light conversion is combined with a blue light emitting element to constitute a white light emitting device, the total radiant flux of the white light will not be decreased, regardless of the fluorescence wavelength.

The light emitting device according to the present invention includes the ceramic composite for light conversion according to the present invention, and can thus achieve a high-efficiency white light emitting device in combination with a blue light emitting element. In addition, the light emitting device according to the present invention includes the ceramic composite for light conversion according to the present invention, and is thus able to be tuned to a white color with less color unevenness or variability, and the ceramic composite for light conversion itself is a bulk body without the need for a sealing resin, and thus capable of achieving higher output and higher efficiency without degradation due to heat or light.

EXAMPLES

Example 1

An $\alpha$-$Al_2O_3$ powder (purity: 99.99%), a $Y_2O_3$ powder (purity: 99.9%), and a $CeO_2$ powder (purity: 99.9%) were weighed respectively so as to provide (x'=) 0.7975 mol in terms of $AlO_{3/2}$, (y'=) 0.2025×(a'=) 0.996 mol in terms of $YO_{3/2}$, and (y'=) 0.2025×(c'=) 0.004 mol. These powders were subjected to wet mixing in ethanol for 16 hours by means of a ball mill, and then to the removal of ethanol as a solvent with the use of an evaporator to obtain a raw material powder. The raw material powder was preliminarily dissolved in a vacuum furnace to provide a raw material for unidirectional solidification.

Next, this raw material was directly put in a molybdenum crucible, the molybdenum crucible was set in a dissolution holding zone of an unidirectional solidification apparatus provided with the dissolution holding zone in an upper section and a cooling zone with a temperature gradient of 100° C./cm set in the vertical direction (solidification direction) in a lower section, and the raw material was melted under the pressure of $1.33 \times 10^{-3}$ Pa ($10^{-5}$ Torr). Next, in the same atmosphere, the molybdenum crucible was lowered at a speed of 7.5 mm/hour to cool the molybdenum crucible from the bottom, thereby providing a solidification product according to Example 1, with a skin portion (a region from the skin to the inside on the order of 1 mm in the case of 54 mm in the diameter of a round-bar solidification product taken out of the molybdenum crucible) composed of a YAG:Ce phase, an $Al_2O_3$ phase, a $CeAlO_3$ phase, and a $CeAl_{11}O_{18}$ phase and with the portion other than the skin composed of a YAG:Ce phase and an $Al_2O_3$ phase.

FIG. 2 shows a micrograph of a sectional texture perpendicular to the solidification direction in the portion of the solidification product other than the skin thereof. A black section A corresponds to the second phase ($Al_2O_3$ phase), whereas a white section B corresponds to the first phase (YAG:Ce phase).

In the following ways, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

x, y, a, and c in the formula (1):

The ground product of the portion of the solidification product other than the skin thereof was melted by heating with sodium carbonate and boric acid, and dissolved by heating with the addition of hydrochloric acid and sulfuric acid. The dissolved product obtained was subjected to inductively-coupled plasma atomic emission spectrometry (ICP-AES) to obtain the relative weights of Al, Y, and Ce, and from the results, the x, y, a, and c were calculated.

The total area (% by area) of the first phase and second phase to the entire cross section of the solidification product:

From an X-ray diffraction pattern for a ground product of the ceramic composite for light conversion according to the present invention, the constituent phases of the ceramic composite for light conversion were identified. Then, a cross section perpendicular to the solidification product of the ceramic composite for light conversion was polished until a mirror surface was obtained, and a reflected electron image of the cross section, in which differences in the compositions of the constituent phases were indicated by differences in monochrome brightness (white to black), was photographed through a scanning electron microscope. More specifically, a structural image was obtained in which the difference between the constituent phases can be clearly distinguished by the brightness. At the same time, a mapping diagram of constituent elements in the same field of view as the reflected electron image was obtained through an elemental analysis with an EDS (Energy Dispersive Spectroscopy) system attached to the scanning electron microscope. From the foregoing results, the YAG:Ce phase, the $Al_2O_3$ phase, and the other phases were clarified on the reflected electron image. Then, the area of the region identified as the other phases was measured, and from the measured area and the area of the entire reflected electron image, the ratio of "the total area of 'the area of a $Y_3Al_5O_{12}$ phase activated with Ce' and 'the area of the $Al_2O_3$ phase'" on the structural image of the cross section of the solidification product, that is, the ratio of the total area of the first phase and second phase was calculated with respect to "the total area of the cross section of the solidification product". This calculation was performed from at least five fields of view in the reflected electron image, and the average value was regarded as the ratio between the respective areas. The foregoing result was regarded as the ratio (% by area) of the total area of the first phase and second phase to "the total area of the cross section of the solidification product" in the cross section of the solidification product of the ceramic composite for light conversion according to the present invention.

Fluorescence Peak Wavelength:

For a disk-shaped sample of φ16 mm×0.2 mm taken from the portion of the solidification product other than the skin thereof, a solid-state quantum efficiency measurement system from JASCO Corporation was used to perform fluorescence characterization with an excitation light wavelength of 460 nm, and measure the fluorescence peak wavelength.

Cy and the Total Radiant Flux:

A light emitting device was prepared as shown in FIG. 1. For the ceramic composite for light conversion 2, a plate-shaped sample of 2 mm×2 mm×0.1 to 0.8 mm was used which was taken from the portion of the solidification product other then the skin thereof. For the light emitting element 3, an LED was used for emitting blue light with a wavelength of 463 nm. The bottom surface of the plate-shaped sample was irradiated with blue light emitted by the LED to make some of the light incident on the bottom surface, and the chromaticity coordinates and total radiant flux of white light radiated from the surface of the plate-shaped sample other than the bottom surface thereof were measured with the use of an integrating sphere. Since the values of the chromaticity coordinates Cx and Cy are increased with increase in sample thickness, a two-axis graph with Cx and Cy as variables and a two-axis graph with Cx and the total radiant flux as variables were created to find out Cy and the total radiant flux in the case of Cx=0.33 from the approximated lines. The fluorescence wavelength of the sample has a tendency to a longer wavelength as the Cy in the case of Cx=0.33 is smaller. The total radiant flux represents a value obtained when the total radiant flux is regarded as 100 in the case of Cx=0.33 in Comparative Example 2 described later.

Example 2

Figure 3:
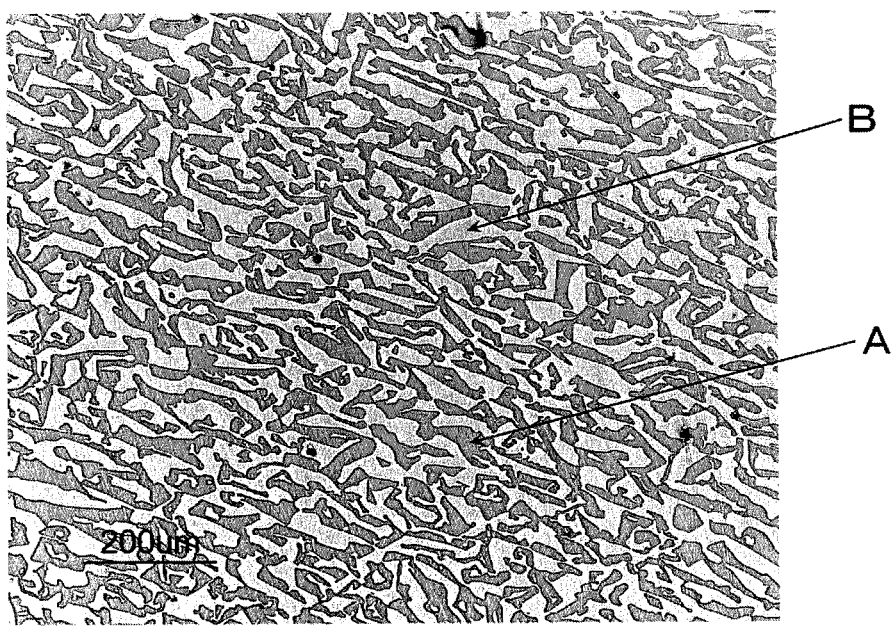
FIG. 3 is a micrograph of a cross section of a ceramic composite for light conversion according to Example 2.

Except that α-$Al_2O_3$ powder (purity: 99.99%), a $Y_2O_3$ powder (purity: 99.9%), and a $CeO_2$ powder (purity: 99.9%) were used as raw materials respectively for 0.7857 mol in terms of $AlO_{3/2}$, 0.2143×0.993 mol in terms of $YO_{3/2}$, and 0.2143×0.007 mol, and that the lowering speed of the molybdenum crucible was adjusted to 5 mm/hour, a solidification product according to Example 2 was obtained by the same process as in Example 1. FIG. 3 shows a micrograph of a sectional texture perpendicular to the solidification direction in the portion of the solidification product other than a skin thereof. A black section A corresponds to the second phase ($Al_2O_3$ phase), whereas a white section B corresponds to the first phase (YAG:Ce phase).

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Example 3

Except that α-$Al_2O_3$ powder (purity: 99.99%), a $Y_2O_3$ powder (purity: 99.9%), and a $CeO_2$ powder (purity: 99.9%) were used as raw materials respectively for 0.7857 mol in terms of $AlO_{3/2}$, 0.2143×0.989 mol in terms of $YO_{3/2}$, and 0.2143×0.011 mol, and that the lowering speed of the molybdenum crucible was adjusted to 4 mm/hour, a solidification product according to Example 3 was obtained by the same process as in Example 1.

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Example 4

Except that α-$Al_2O_3$ powder (purity: 99.99%), a $Y_2O_3$ powder (purity: 99.9%), and a $CeO_2$ powder (purity: 99.9%) were used as raw materials respectively for 0.7857 mol in terms of $AlO_{3/2}$, 0.2143×0.984 mol in terms of $YO_{3/2}$, and 0.2143×0.016 mol, and that the lowering speed of the molybdenum crucible was adjusted to 3 mm/hour, a solidification product according to Example 4 was obtained by the same process as in Example 1. The solidification product had a skin portion composed of a YAG:Ce phase, an $Al_2O_3$ phase, a $CeAlO_3$ phase, and a $CeAl_{11}O_{18}$ phase, and has the portion other than the skin composed of a YAG:Ce phase, an $Al_2O_3$ phase, and a $CeAlO_3$ phase.

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Example 5

Except that α-$Al_2O_3$ powder (purity: 99.99%), a $Y_2O_3$ powder (purity: 99.9%), and a $CeO_2$ powder (purity: 99.9%) were used as raw materials respectively for 0.7975 mol in terms of $AlO_{3/2}$, 0.2025×0.989 mol in terms of $YO_{3/2}$, and 0.2025×0.011 mol, and that the lowering speed of the molybdenum crucible was adjusted to 4.5 mm/hour, a solidification product according to Example 5 was obtained by the same process as in Example 1.

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Example 6

Except that α-$Al_2O_3$ powder (purity: 99.99%), a $Y_2O_3$ powder (purity: 99.9%), and a $CeO_2$ powder (purity: 99.9%) were used as raw materials respectively for 0.811 mol in terms of $AlO_{3/2}$, 0.189×0.984 mol in terms of $YO_{3/2}$, and 0.189×0.016 mol, and that the lowering speed of the molybdenum crucible was adjusted to 3 mm/hour, a solidification product according to Example 6 was obtained by the same process as in Example 1.

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Comparative Example 1

Except that α-$Al_2O_3$ powder (purity: 99.99%), a $Y_2O_3$ powder (purity: 99.9%), and a $CeO_2$ powder (purity: 99.9%) were used as raw materials respectively for 0.7800 mol in terms of $AlO_{3/2}$, 0.2200×0.8500 mol in terms of $YO_{3/2}$, and 0.2200×0.1500 mol, that the temperature gradient was adjusted to 30° C./cm in the cooling zone of the unidirectional solidification apparatus, and that the lowering speed of the molybdenum crucible was adjusted to 5 mm/hour, a solidification product according to Comparative Example 1 was obtained by the same process as in Example 1. The solidification product was composed of a YAG:Ce phase, an $Al_2O_3$ phase, and a $CeAl_{11}O_{18}$ phase.

Figure 4:
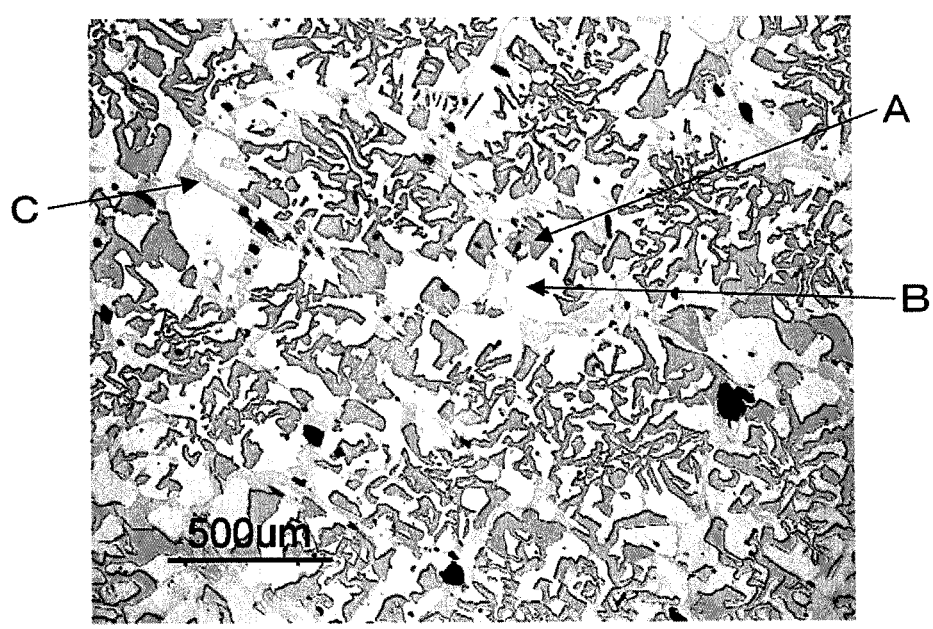
FIG. 4 is a micrograph of a cross section of a ceramic composite for light conversion according to Comparative Example 1.

FIG. 4 shows a micrograph of a sectional texture perpendicular to the solidification direction of the solidification product. A black section A corresponds to the $Al_2O_3$ phase, a white section B corresponds to the YAG:Ce phase, and a gray section C corresponds to the $CeAl_{11}O_{18}$ phase.

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Comparative Example 2

Except that α-$Al_2O_3$ powder (purity: 99.99%), a $Y_2O_3$ powder (purity: 99.9%), and a $CeO_2$ powder (purity: 99.9%) were used as raw materials respectively for 0.8200 mol in terms of $AlO_{3/2}$, 0.1800×0.8750 mol in terms of $YO_{3/2}$, and 0.1800×0.1250 mol, a solidification product according to Comparative Example 2, composed of the same phases as in Comparative Example 1, was obtained by the same process as in Comparative Example 1.

As in the case of Example 1, the x, y, a, and c in the formula (1), the total area (% by area) of the first phase and second phase to the entire cross section of the solidification product, the fluorescence peak wavelength (nm), Cy, and the total radiant flux were found out for the portion of the obtained solidification product other than the skin thereof. The results are shown in Table 1.

Comparative Example 3

Except that α-$Al_2O_3$ powder (purity: 99.99%), a $Y_2O_3$ powder (purity: 99.9%), and a $CeO_2$ powder (purity: 99.9%) were used as a raw material composition respectively for 0.8550 mol in terms of $AlO_{3/2}$, 0.1450×0.9900 mol in terms of $YO_{3/2}$, and 0.1450×0.0100 mol, a solidification product according to Comparative Example 3 was obtained by the same process as in Comparative Example 1. In the solidification product obtained, a lower about half region thereof was composed of coarse $Al_2O_3$ primary crystals and an eutectic region of a YAG:Ce phase and an $Al_2O_3$ phase, whereas an upper about half region was composed of a YAG:Ce phase, an $Al_2O_3$ phase, and a $CeAlO_3$ phase. In addition, the solidification product obtained was polycrystalline with more than one crack.

Comparative Example 4

Except that α-$Al_2O_3$ powder (purity: 99.99%), a $Y_2O_3$ powder (purity: 99.9%), and a $CeO_2$ powder (purity: 99.9%) were used as raw materials respectively for 0.7200 mol in terms of $AlO_{3/2}$, 0.2800×0.9900 mol in terms of $YO_{3/2}$, and 0.2800×0.0100 mol, a solidification product according to Comparative Example 4 was obtained by the same process as in Comparative Example 1. In the solidification product obtained, a lower about ⅓ region thereof was composed of coarse YAG:Ce primary crystals and an eutectic region of a YAG:Ce phase and an $Al_2O_3$ phase, whereas an upper about ⅔ region was composed of a YAG:Ce phase, an $Al_2O_3$ phase, and a $CeAlO_3$ phase. In addition, the solidification product obtained was polycrystalline with more than one crack.

fluorescence peak wavelength (nm), Cy, and the total radiant flux were found out for the portion of the obtained solidification product other than the skin thereof. The results are shown in Table 2.

As for the x, y, a, b, and c in the formula (2), as in the case of Example 1, inductively-coupled plasma atomic emission

TABLE 1

| | x | y | a | c | (First Phase + Second Phase)/ Entire Cross Section of Solidification Product (% by area) | Fluorescence Peak Wavelength (nm) | Cy (at Cx = 0.33) | Total Radiant Flux (at Cx = 0.33) |
|---|---|---|---|---|---|---|---|---|
| Example1 | 0.791 | 0.209 | 0.998 | 0.002 | 100 | 551 | 0.400 | 125 |
| Example2 | 0.777 | 0.223 | 0.996 | 0.004 | 100 | 555 | 0.383 | 123 |
| Example3 | 0.780 | 0.220 | 0.994 | 0.006 | 100 | 558 | 0.376 | 122 |
| Example4 | 0.770 | 0.230 | 0.992 | 0.008 | 99 | 562 | 0.365 | 119 |
| Example5 | 0.788 | 0.212 | 0.994 | 0.006 | 100 | 559 | 0.375 | 120 |
| Example6 | 0.803 | 0.197 | 0.992 | 0.008 | 99 | 563 | 0.363 | 117 |
| Comparative Example1 | 0.780 | 0.220 | 0.850 | 0.150 | 92 | 558 | 0.377 | 85 |
| Comparative Example2 | 0.821 | 0.179 | 0.875 | 0.125 | 95 | 550 | 0.410 | 100 |
| Comparative Example3 | | | | | Having many cracks, varying greatly in quality, not suitable for light conversion members | | | |
| Comparative Example4 | | | | | Having many cracks, varying greatly in quality, not suitable for light conversion members | | | |

Example 7

An $\alpha$-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were weighed respectively so as to provide (x'=) 0.7975 mol in terms of $AlO_{3/2}$, (y'=) 0.2025× (a'=) 0.921 mol in terms of $YO_{3/2}$, (y'=) 0.2025×(b'=) 0.075 mol in terms of $GdO_{3/2}$, and (y'=) 0.2025×(c'=) 0.004 mol. These powders were subjected to wet mixing in ethanol for 16 hours by means of a ball mill, and then to the removal of ethanol as a solvent with the use of an evaporator to obtain a raw material powder. The raw material powder was preliminarily dissolved in a vacuum furnace to provide a raw material for unidirectional solidification.

Next, this raw material was directly put in a molybdenum crucible, and the molybdenum crucible was set in a dissolution holding zone of an unidirectional solidification apparatus provided with the dissolution holding zone in an upper section and a cooling zone with a temperature gradient of 100° C./cm set in the vertical direction (solidification direction) in a lower section, and the raw material was melted under the pressure of $1.33 \times 10^{-3}$ Pa ($10^{-5}$ Torr). Next, in the same atmosphere, the molybdenum crucible was lowered at a speed of 7.5 mm/hour to cool the molybdenum crucible from the bottom, thereby providing a solidification product according to Example 7, with a skin portion (a region from the skin to the inside on the order of 1 mm in the case of 54 mm in the diameter of a round-bar solidification product taken out of the molybdenum crucible) composed of a YAG:(Gd, Ce) phase, an $Al_2O_3$ phase, a (Gd, Ce) $AlO_3$ phase, and a (Gd, Ce)$Al_{11}O_{18}$ phase and with the portion other than the skin composed of a YAG:(Gd, Ce) phase and an $Al_2O_3$ phase.

Figure 5:
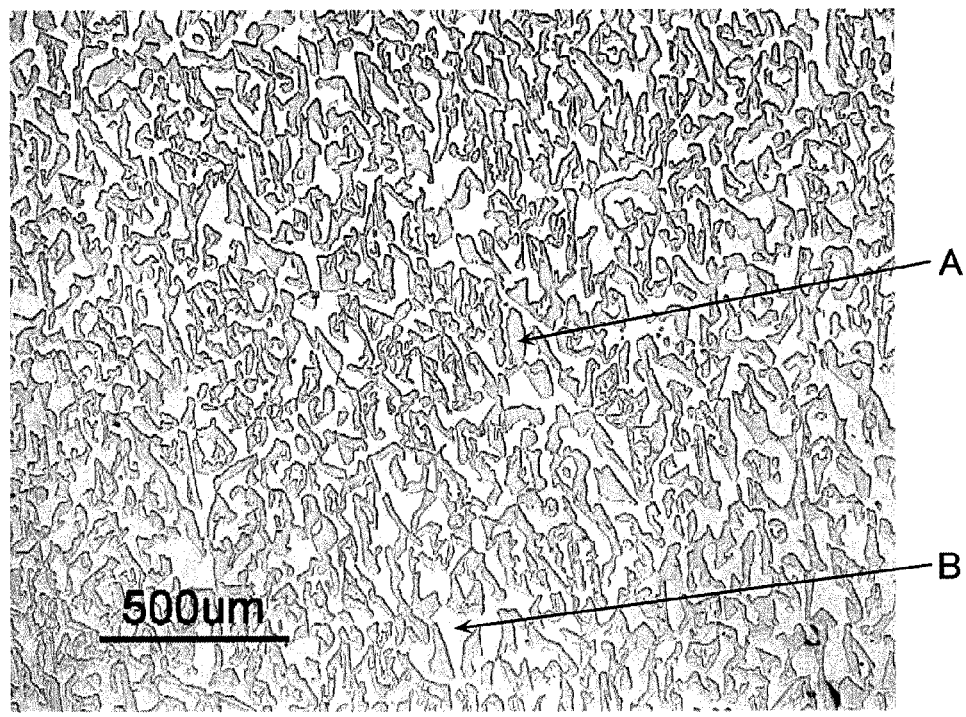
FIG. 5 is a micrograph of a cross section of a ceramic composite for light conversion according to Example 7.

FIG. 5 shows a micrograph of a sectional texture perpendicular to the solidification direction in the portion of the solidification product other than the skin thereof. A black section A corresponds to the second phase ($Al_2O_3$ phase), whereas a white section B corresponds to the first phase (YAG:(Gd, Ce) phase).

In the following ways, the x, y, a, b, and c in the formula (2), the total area (% by area) of the first phase and second phase to the entire cross section of the solidification product, the spectrometry (ICP-AES) was carried out to obtain the relative weights of Al, Y, Gd, and Ce, and from the results, the x, y, a, b, and c were calculated. The fluorescence peak wavelength was measured as in the case of Example 1. The Cy and the total radiant flux in the case of Cx=0.33 were measured as in the case of Example 1. However, the total radiant flux represents a value obtained when the total radiant flux is regarded as 100 in the case of Cx=0.33 in Comparative Example 5 described later.

As for the total area (% by area) of the first phase and second phase to the entire cross section of the solidification product, the YAG:(Gd, Ce) phase, the $Al_2O_3$ phase, and the other phases were clarified on a reflected electron image in the same way as in Example 1, then, the area of the region identified as the other phases was measured, and from the measured area and the area of the entire reflected electron image, the ratio of "the total area of 'the area of a $Y_3Al_5O_{12}$ phase activated with Gd and Ce' and 'the area of the $Al_2O_3$ phase'" on the structural image of the cross section of the solidification product, that is, the ratio of the total area of the first phase and second phase was calculated with respect to "the total area of the cross section of the solidification product". This calculation was performed from at least five fields of view in the reflected electron image, and the average value was regarded as the ratio between the respective areas.

Example 8

Except that $\alpha$-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used as raw materials respectively for (x'=) 0.7857 mol in terms of $AlO_{3/2}$, (y'=) 0.2143×(a'=) 0.918 mol in terms of $YO_{3/2}$, (y'=) 0.2143 mol×(b'=) 0.075 in terms of $GdO_{3/2}$, and (y'=) 0.2143×(c'=) 0.007 mol, and that the crucible lowering speed was adjusted to 6 mm/hour, a solidification product according to Example 8 was obtained by the same process as in Example 7.

As in the case of Example 7, the x, y, a, b, and c in the formula (2), the total area (% by area) of the first phase and second phase to the cross section of the solidification product, the fluorescence peak wavelength (nm), Cy and the total radiant flux in the case of Cx=0.33 were found out for the portion of the obtained solidification product other than the skin thereof. The results are shown in Table 2.

Example 9

Except that α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used as raw materials respectively for (x'=) 0.7857 mol in terms of $AlO_{3/2}$, (y'=) 0.2143×(a'=) 0.921 mol in terms of $YO_{3/2}$, (y'=) 0.2143×(b'=) 0.13 mol in terms of $GdO_{3/2}$, and (y'=) 0.2143 mol×(c'=) 0.01 mol, and that the crucible lowering speed was adjusted to 4.5 mm/hour, a solidification product according to Example 9 was obtained by the same process as in Example 7.

As in the case of Example 7, the x, y, a, b, and c in the formula (2), the total area (% by area) of the first phase and second phase to the cross section of the solidification product, the fluorescence peak wavelength (nm), Cy and the total radiant flux in the case of Cx=0.33 were found out for the portion of the obtained solidification product other than the skin thereof. The results are shown in Table 2.

Comparative Example 5

Except that α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used as raw materials respectively for (x'=) 0.8200 mol in terms of $AlO_{3/2}$, (y'=) 0.1800×(a'=) 0.84 mol in terms of $YO_{3/2}$, (y'=) 0.1800×(b'=) 0.10 mol in terms of $GdO_{3/2}$, and (y'=) 0.1800 mol×(c'=) 0.06 mol, that the temperature gradient was adjusted to 30° C./cm in the solidification cooling zone of the unidirectional solidification apparatus, and that the crucible lowering speed was adjusted to 5 mm/hour, a solidification product according to Comparative Example 1 was obtained by the same process as in Example 1. The solidification product was composed of a YAG:(Gd, Ce) phase, an $Al_2O_3$ phase, and a (Gd, Ce)$Al_{11}O_{18}$ phase.

Figure 6:
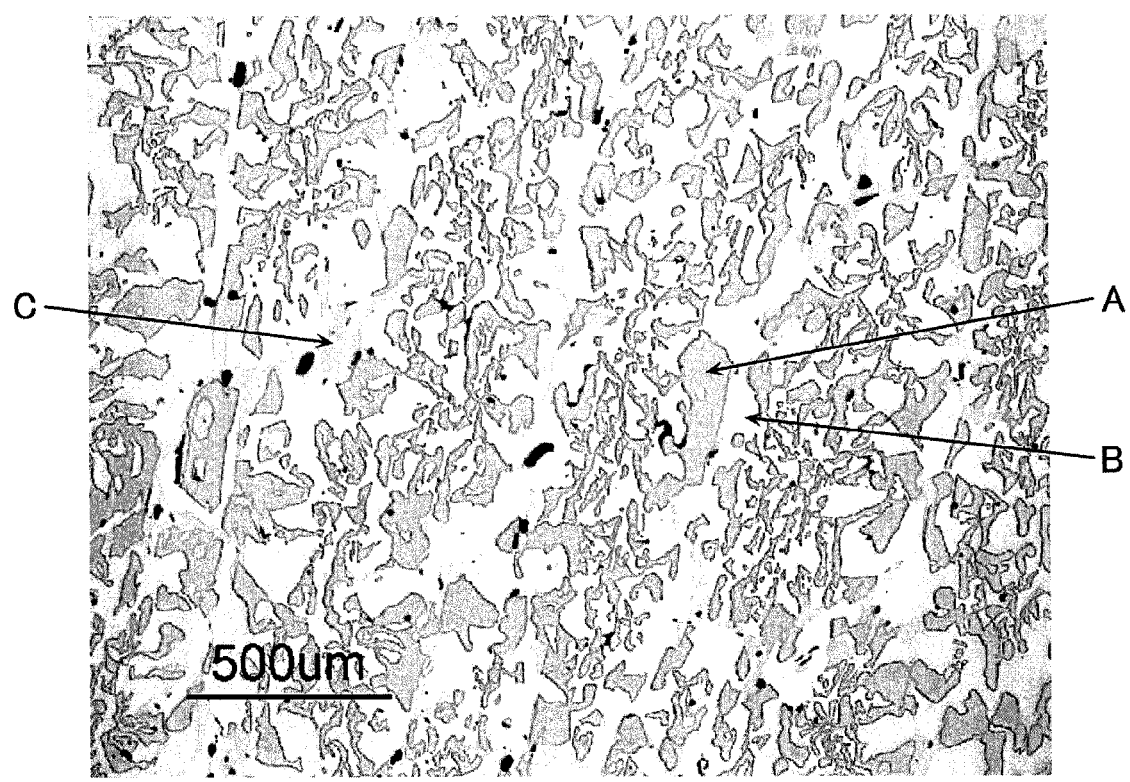
FIG. 6 is a micrograph of a cross section of a ceramic composite for light conversion according to Comparative Example 5.

FIG. 6 shows a micrograph of a sectional texture perpendicular to the solidification direction of the solidification product. A black section A corresponds to the $Al_2O_3$ phase, a white section B corresponds to the YAG:Ce phase, and a gray section C corresponds to the (Gd, Ce)$Al_{11}O_{18}$ phase.

As in the case of Example 7, the x, y, a, b, and c in the formula (2), the total area (% by area) of the first phase and second phase to the cross section of the solidification product, the fluorescence peak wavelength (nm), Cy and the total radiant flux in the case of Cx=0.33 were found out for the portion of the obtained solidification product other than the skin thereof. The results are shown in Table 2.

Comparative Example 6

Except that α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used as raw materials respectively for (x'=) 0.8200 mol in terms of $AlO_{3/2}$, (y'=) 0.1800×(a'=) 0.921 mol in terms of $YO_{3/2}$, (y'=) 0.1800×(b'=) 0.20 mol in terms of $GdO_{3/2}$, and (y' 0.1800 mol×(c' 0.03 mol, a solidification product according to Comparative Example 6, composed of the same phases as in Comparative Example 5, was obtained by the same process as in Comparative Example 5.

As in the case of Example 7, the x, y, a, b, and c in the formula (2), the total area (% by area) of the first phase and second phase to the cross section of the solidification product, the fluorescence peak wavelength (nm), Cy and the total radiant flux in the case of Cx=0.33 were found out for the portion of the obtained solidification product other than the skin thereof. The results are shown in Table 2.

Comparative Example 7

Except that α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used as raw materials respectively for (x'=) 0.7800 mol in terms of $AlO_{3/2}$, (y'=) 0.2200×(a'=) 0.921 mol in terms of $YO_{3/2}$, (y'=) 0.2200×(b'=) 0.6 mol in terms of $GdO_{3/2}$, and (y' 0.2200 mol×(c'=) 0.15 mol, a solidification product according to Comparative Example 7, composed of the same phases as in Comparative Example 5, was obtained by the same process as in Comparative Example 5.

As in the case of Example 7, the x, y, a, b, and c in the formula (2), the total area (% by area) of the first phase and second phase to the cross section of the solidification product, the fluorescence peak wavelength (nm), Cy and the total radiant flux in the case of Cx=0.33 were found out for the portion of the obtained solidification product other than the skin thereof. The results are shown in Table 2.

Comparative Example 8

Except that α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used as raw materials respectively for (x'=) 0.8550 mol in terms of $AlO_{3/2}$, (y'=) 0.1450×(a'=) 0.921 mol in terms of $YO_{3/2}$, (y'=) 0.1450×(b'=) 0.10 mol in terms of $GdO_{3/2}$, and (y'=) 0.1450 mol×(c'=) 0.01 mol, a solidification product composed of the same phases as in Comparative Example 5 was obtained by the same process as in Comparative Example 5. In the solidification product obtained, a lower about half region thereof was composed of coarse $Al_2O_3$ primary crystals and an eutectic region of a YAG:Gd, Ce phase and an $Al_2O_3$ phase, whereas an upper about half region was composed of a YAG:Gd, Ce phase, an $Al_2O_3$ phase, and a (Gd, Ce)$AlO_3$ phase. In addition, the solidification product obtained was polycrystalline with more than one crack.

Comparative Example 9

Except that α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were used respectively for a raw material composition with (x'=) 0.7200 mol in terms of $AlO_{3/2}$, (y'=) 0.2800×(a'=) 0.921 mol in terms of $Y^O_{3/2}$, (y'=) 0.2800×(b'=) 0.10 mol in terms of $GdO_{3/2}$, and (y'=) 0.2800 mol×(c'=) 0.01 mol, a solidification product composed of the same phases as in Comparative Example 5 was obtained by the same process as in Comparative Example 5. In the solidification product obtained, a lower about ⅓ region thereof was composed of coarse YAG:Gd, Ce primary crystals and an eutectic region of a YAG:Gd, Ce phase and an $Al_2O_3$ phase, whereas an upper about ⅔ region was composed of a YAG:Gd, Ce phase, an $Al_2O_3$ phase, and a (Gd, Ce)$AlO_3$ phase. In addition, the solidification product obtained was polycrystalline with more than one crack.

TABLE 2

|  | x | y | a | b | c | (YAG: Gd, Ce + $Al_2O_3$)/ Entire Cross Section of Solidification Product (% by Area) | Fluorescence Peak Wavelength (nm) | Cy (at Cx = 0.33) | Total Radiant Flux (at Cx = 0.33) |
|---|---|---|---|---|---|---|---|---|---|
| Example7 | 0.792 | 0.208 | 0.943 | 0.055 | 0.002 | 100 | 561 | 0.371 | 134 |
| Example8 | 0.781 | 0.219 | 0.939 | 0.057 | 0.004 | 100 | 567 | 0.36 | 131 |
| Example9 | 0.777 | 0.223 | 0.906 | 0.088 | 0.006 | 100 | 575 | 0.321 | 130 |
| Comparative Example5 | 0.823 | 0.177 | 0.84 | 0.1 | 0.06 | 94 | 563 | 0.355 | 100 |
| Comparative Example6 | 0.818 | 0.182 | 0.77 | 0.2 | 0.03 | 95 | 563 | 0.357 | 102 |
| Comparative Example7 | 0.775 | 0.225 | 0.35 | 0.6 | 0.15 | 90 | 579 | 0.302 | 67 |
| Comparative Example8 | | | | | | Having many cracks, varying greatly in quality, not suitable for light conversion members | | | |
| Comparative Example9 | | | | | | Having many cracks, varying greatly in quality, not suitable for light conversion members | | | |

REFERENCE SIGNS LIST

1 Light emitting device
2 Ceramic composite for light conversion
3 Light emitting element (light emitting diode element)
4 Jig
5 Lead wire
6 Lead electrode

The invention claimed is:

1. A ceramic composite for light conversion, the ceramic composite being a solidification product comprising a composition represented by the formula (1), the composition having a texture of continuously and three-dimensionally mutually entangled oxide phases comprising at least two phases of a first phase and a second phase, characterized in that
the first phase is a $Y_3Al_5O_{12}$ fluorescent phase activated with Ce, and the second phase is an $Al_2O_3$ phase, and
the first phase and second phase account for 97% by area or more of a cross section of the solidification product

[Formula 1]

$$xAlO_{3/2}\text{-}y(aYO_{3/2}\text{-}cCeO_2) \quad (1)$$

(x, y, a, and c represent molar fractions, 0.770<x<0.835; 0.002≤c<0.012; x+y=1; and a+c=1).

2. The ceramic composite for light conversion according to claim 1, characterized in that the ceramic composite absorbs light with a peak at a wavelength of 420 nm to 500 nm to produce fluorescence with a peak at 550 nm to 565 nm.

3. A ceramic composite for light conversion, the ceramic composite being a solidification product comprising a composition represented by the formula (2), the composition having a texture of continuously and three-dimensionally mutually entangled oxide phases comprising at least two phases of a first phase and a second phase, characterized in that
the first phase is a $Y_3Al_5O_{12}$ fluorescent phase activated with Gd and Ce, and the second phase is an $Al_2O_3$ phase, and
the first phase and second phase account for 97% by area or more of a cross section of the solidification product

[Formula 2]

$$xAlO_{3/2}\text{-}y(aYO_{3/2}\text{-}bGdO_{3/2}\text{-}cCeO_2) \quad (2)$$

(x, y, a, b, and c represent molar fractions, 0.770<x<0.835; 0<b<0.2, 0<c<0.01; x+y=1; and a+b+c=1).

4. The ceramic composite for light conversion according to claim 3, characterized in that the ceramic composite absorbs light with a peak at a wavelength of 420 nm to 500 nm to produce fluorescence with a peak at 550 nm to 580 nm.

5. A light emitting device characterized in that is comprises a light emitting element and the ceramic composite for light conversion according to claim 1.

6. A light emitting device characterized in that is comprises a light emitting element and the ceramic composite for light conversion according to claim 2.

7. A light emitting device characterized in that is comprises a light emitting element and the ceramic composite for light conversion according to claim 3.

8. A light emitting device characterized in that is comprises a light emitting element and the ceramic composite for light conversion according to claim 4.

9. The light emitting device according to claim 6, characterized in that the light emitting element emits light with a peak at a wavelength of 420 nm to 500 nm.

10. The light emitting device according to claim 8, characterized in that the light emitting element emits light with a peak at a wavelength of 420 nm to 500 nm.

11. The light emitting device according to claim 5, characterized in that the light emitting element is a light emitting diode element.

12. The light emitting device according to claim 6, characterized in that the light emitting element is a light emitting diode element.

13. The light emitting device according to claim 7, characterized in that the light emitting element is a light emitting diode element.

14. The light emitting device according to claim 8, characterized in that the light emitting element is a light emitting diode element.

15. The light emitting device according to claim 9, characterized in that the light emitting element is a light emitting diode element.

16. The light emitting device according to claim 10, characterized in that the light emitting element is a light emitting diode element.

17. A method for producing a ceramic composite for light conversion according to claim 1, by melting a raw material oxide and solidifying the melt by an unidirectional solidification method,
characterized in that the raw material oxide is a composition represented by the formula (3), a temperature decrease gradient of 40° C./cm or more is provided in a solidification direction of the unidirectional solidification method, and a transfer rate is 25 mm/hour or less in the solidification direction

[Formula 3]

$$x'\text{AlO}_{3/2}\text{-}y'(a'\text{YO}_{3/2}\text{-}c'\text{CeO}_2) \quad (3)$$

(x', y', a', and c' represent molar fractions, 0.770<x'<0.835; 0.004≤c'<0.04; x'+y'=1; and a'+c'=1).

18. A method for producing a ceramic composite for light conversion according to claim 2, by melting a raw material oxide and solidifying the melt by an unidirectional solidification method,
characterized in that the raw material oxide is a composition represented by the formula (3), a temperature decrease gradient of 40° C./cm or more is provided in a solidification direction of the unidirectional solidification method, and a transfer rate is 25 mm/hour or less in the solidification direction

[Formula 3]

$$x'\text{AlO}_{3/2}\text{-}y'(a'\text{YO}_{3/2}\text{-}c'\text{CeO}_2) \quad (3)$$

(x', y', a', and c' represent molar fractions, 0.770<x'<0.835; 0.004≤c'<0.04; x'+y'=1; and a'+c'=1).

19. A method for producing a ceramic composite for light conversion according to claim 3, by melting a raw material oxide and solidifying the melt by an unidirectional solidification method,
characterized in that the raw material oxide is a composition represented by the formula (4), a temperature decrease gradient of 40° C./cm or more is provided in a solidification direction of the unidirectional solidification method, and a transfer rate is 25 mm/hour or less in the solidification direction,

[Formula 4]

$$x'\text{AlO}_{3/2}\text{-}y'(a'\text{YO}_{3/2}\text{-}b'\text{GdO}_{3/2}\text{-}c'\text{CeO}_2) \quad (4)$$

(x', y', a', b', and c' represent molar fractions, 0.770<x'<0.835; 0<b'<0.3, 0.001≤c'<0.04; x'+y'=1; and a'+b'+c'=1).

20. A method for producing a ceramic composite for light conversion according to claim 4, by melting a raw material oxide and solidifying the melt by an unidirectional solidification method,
characterized in that the raw material oxide is a composition represented by the formula (4), a temperature decrease gradient of 40° C./cm or more is provided in a solidification direction of the unidirectional solidification method, and a transfer rate is 25 mm/hour or less in the solidification direction

[Formula 4]

$$x'\text{AlO}_{3/2}\text{-}y'(a'\text{YO}_{3/2}\text{-}b'\text{GdO}_{3/2}\text{-}c'\text{CeO}_2) \quad (4)$$

(x', y', a', b', and c' represent molar fractions, 0.770<x'<0.835; 0<b'<0.3, 0.001≤c'<0.04; x'+y'=1; and a'+b'+c'=1).

* * * * *